United States Patent [19]
Iknaian et al.

[11] Patent Number: 5,198,758
[45] Date of Patent: Mar. 30, 1993

[54] METHOD AND APPARATUS FOR COMPLETE FUNCTIONAL TESTING OF A COMPLEX SIGNAL PATH OF A SEMICONDUCTOR CHIP

[75] Inventors: Russell Iknaian, Groton; Richard B. Watson, Jr., Harvard, both of Mass.

[73] Assignee: Digital Equipment Corp., Maynard, Mass.

[21] Appl. No.: 764,314

[22] Filed: Sep. 23, 1991

[51] Int. Cl.$^5$ ............................................. G01R 31/28
[52] U.S. Cl. ................................ 324/158 R; 324/73.1; 371/15.1; 371/22.1
[58] Field of Search .......................... 324/158 R, 73.1; 371/15.1, 22.1, 22.2, 25, 27; 437/8; 307/551

[56] References Cited

U.S. PATENT DOCUMENTS

| | | | |
|---|---|---|---|
| 4,703,257 | 10/1987 | Nishida et al. | 324/158 R |
| 4,782,283 | 11/1988 | Zasio | 324/158 R |
| 4,931,722 | 6/1990 | Stoica | 324/158 R |
| 5,003,256 | 3/1991 | Merrill | 324/158 R |

*Primary Examiner*—Vinh Nguyen
*Attorney, Agent, or Firm*—Cesari and McKenna

[57] ABSTRACT

A test register coupled to an absolute delay regulator circuit of a clock repeater chip enables complete functional testing of a clock delay path of the regulator. The test register is connected to a measurement latch of the clock path in a "logical OR" configuration with respect to a measurement delay line and is enabled during a test mode by control logic of the repeater chip. Operationally, a sequence of logic "0" bits are forced in the measurement delay line during test mode. A state machine clears the measurement latch, and then loads a test pattern into the test register. As each bit of the register is set, a corresponding bit in the measurement latch is also set to simulate a measurement cycle; the results of the "measurement" are stored in the measurement latch. Once the test pattern is loaded, the repeater chip is placed into a measurement test mode. Execution of a measurement test cycle then propagates the test pattern throughout the clock delay path of the regulator. An output clock signal is sampled and if determined present, indicates that the clock path column under test is functional. Each column of the clock path is then tested separately in sequence.

11 Claims, 7 Drawing Sheets

METHOD AND APPARATUS FOR COMPLETE FUNCTIONAL TESTING OF A COMPLEX SIGNAL PATH OF A SEMICONDUCTOR CHIP

BACKGROUND OF THE INVENTION

This invention relates generally to testing methods and apparatus and, more specifically, to complete functional testing of a relatively wide and complex data path of an absolute delay regulator located on a clock repeater chip.

An absolute delay regulator of this type is disclosed in a U.S. Pat. application Ser. No. 07/764,514 copending titled, METHOD AND APPARATUS FOR CLOCK SKEW REDUCTION THROUGH ABSOLUTE DELAY REGULATION, by Watson et al., filed herewith, which application is expressly incorporated by reference as though fully set forth herein.

A measurement circuit of the absolute delay regulator determines the intrinsic propagation delay of a clock signal processing circuit on a repeater chip by using a measurement pulse propagating through a "replica loop" and a delay line; the length of delay line traversed by the pulse in a predetermined time interval is stored in a measurement latch. The contents of the latch are decoded and transferred to a control register that controls a delay-adjusting unit; the unit also includes a tapped delay line cascaded with the processing circuitry. The delay imposed on an input clock signal by the latter delay line is adjusted by selecting one of its taps in response to the decoded contents of the latch.

The measurements made by the measurement circuit and the resulting tap selection on the tapped delay line depend on process, voltage, temperature and load (PVTL) variations to which the chip is subjected. It is difficult to simulate PVTL variations in sufficient increments to functionally test each component and connection between components of the data path for the full range of these variations. Unless all the data path circuitry can be functionally tested, the chip may fail during operation.

Therefore, it is among the objects of the invention to provide a method and apparatus for complete functional testing of a complex data path of an absolute delay regulator located on a clock repeater chip.

Another object of the present invention is to provide a method and apparatus for complete functional testing of the data path during manufacture of the chip.

SUMMARY OF THE INVENTION

Briefly, a testing apparatus constructed in accordance with the invention includes a test register coupled to an absolute delay regulator circuit to enable complete functional testing of a clock delay path of the regulator. The test register is a shift register whose stages are connected to a measurement latch of the clock delay path in a "logical OR" configuration with respect to a measurement delay line. The test register is enabled during a test mode by control logic of the repeater chip. Specifically, a mode control logic unit and a clock path control logic unit generate timing signals for activating the clock delay path logic of the delay regulator during test mode.

Operationally, a sequence of logic "0" bits are forced in the measurement delay line during test mode. A state machine of the clock path control logic clears the measurement latch using a CLRMEAS signal. A logic "1's-only" test bit pattern corresponding to the minimum delay provided by the delay line is then shifted into the test register using a TEST_CLK signal. As each bit of the register is set, a corresponding bit in the measurement latch is also set to simulate the result of a measurement cycle.

Once the test pattern is loaded, the repeater chip is placed into a measurement test mode. Since the measurement delay line is fully loaded with logic "0" bits, the contents of the test register override the output of the measurement delay line. Execution of a measurement test cycle then propagates the test pattern throughout the clock delay path of the regulator. An output clock signal is sampled and if determined present, indicates that the clock path is functional for the "bit-slice" of the clock path exercised by the test pattern.

Another test pattern corresponding to an incremental amount of delay is loaded into the test register and the measurement test cycle is executed. This procedure is repeated until a test pattern corresponding to the maximum delay provided by the delay line is loaded, the measurement test cycle executed, and the output signal sampled to indicate a fully functional chip; i.e., each bit-slice of the clock path has been individually tested.

Therefore, in accordance with the purpose of the invention as embodied and broadly described herein, an apparatus is provided for testing logic devices of a complex signal path of a semiconductor chip. The complex signal path of the chip includes a measurement delay line circuit and a measurement latch circuit. The apparatus comprises: means for placing the chip in a test mode to deactivate the measurement delay line and force a sequence of unasserted bits into the delay line, the test mode further comprising a plurality of sub-test modes for enabling complete functional testing of the complex signal path including: (i) means for inserting a selected pattern of asserted bits into a test register of the complex signal path when the chip is placed in a shift sub-mode of the test mode, the selected pattern of asserted bits comprising a test pattern, and (ii) means for loading the test pattern into the measurement latch of the complex signal path when the chip is place in a measurement test sub-mode of the test mode; means for placing the chip in a measurement test mode to enable a measurement test operation on the test pattern; means for generating timing signals to activate the logic devices of the signal path during the test and measurement modes; and means for sampling an output signal of the chip to determine whether the output signal is present. As a result, the presence of the output signal indicates that a portion of the complex signal path exercised by the test pattern is functional.

An advantage of this arrangement is that the testing feature provides for manufacture testing of the PVTL clock delay path without subjecting the chip to severe environmental conditions. Another advantage is that the invention allows for complete functional testing of the clock delay path at a "wafer-probe" stage and prior to installing the chip (and module) in a computer system.

BRIEF DESCRIPTION OF THE DRAWINGS

The above and further advantages of the invention may be better understood, by referring to the following description in conjunction with the accompanying drawings, in which.

DETAILED DESCRIPTION OF ILLUSTRATIVE EMBODIMENTS

Figure 1:
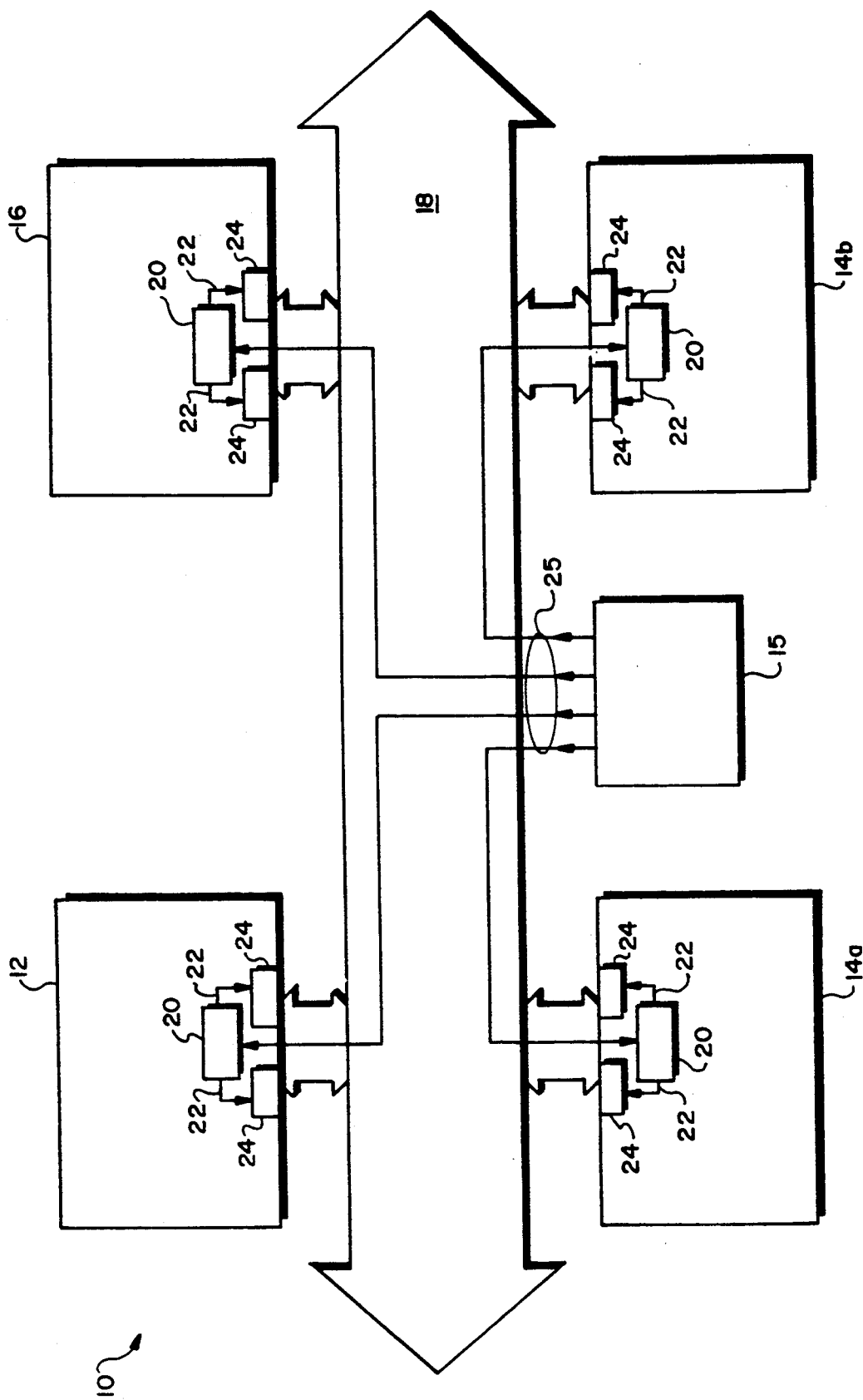
FIG. 1 is a block diagram of a computer system including modules having a clock repeater chip for receiving a globally distributed system clock signal.

Referring to FIG. 1, a synchronous computer system 10 typically includes a central processing unit module 12, main memory modules 14a, 14b and an input/output unit module 16 interconnected by a high-speed, bidirectional synchronous bus 18. A clock module 15 generates a system clock signal to synchronize the operations of the computer system. The system clock signal is globally-distributed via separate, generally radial, unidirectional clock lines 25 of the synchronous bus 18 to each module of the computer 10.

A clock repeater chip 20 located on each module receives the distributed system clock signal as an input signal. The repeater chip 20 is preferably a VLSI CMOS custom integrated circuit chip functionally configured to shape and amplify the input signal prior to generating multiple copies of it. The resulting output clock signals are thereafter distributed to circuitry, e.g., bus interface circuitry 24, on each module. Preferably, the chip 20 converts controlled-edge, system clock signals with low-level voltages to a 0–5v, 50% duty cycle digital pulse required by the bus interface chips 24.

Any number of clock signals may be "skew-regulated" by the repeater chip 20 by including additional delay regulation circuitry, as further described below. In general, the clock signals may have phases different than the system clock signal. For example, an embodiment of the present invention may support two clock channels. The second channel supports delay regulation and distribution of a second clock signal having the same frequency as the system clock signal, but locked in phase quadrature.

Figure 2:
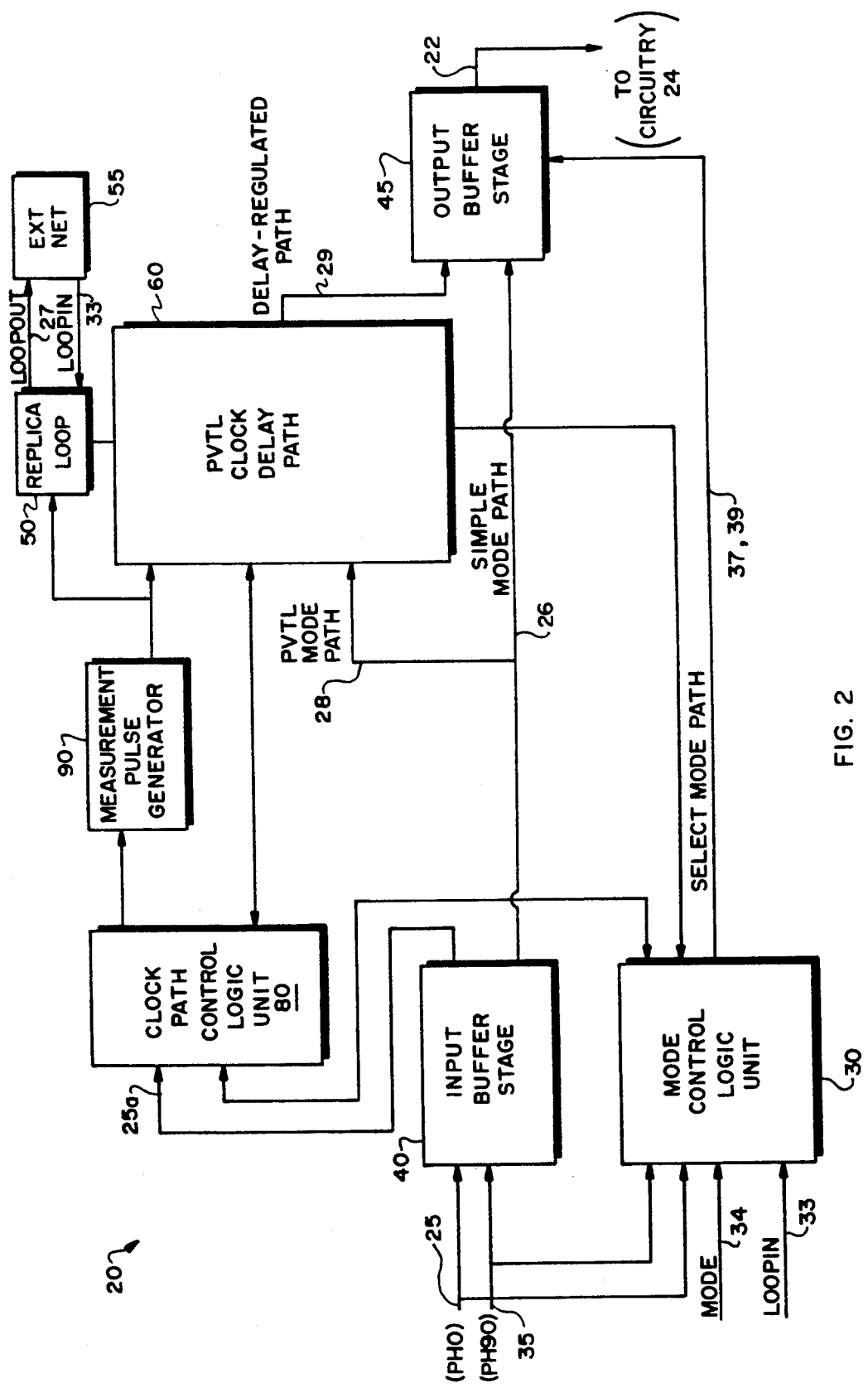
FIG. 2 is a block diagram of the clock repeater chip including a delay regulator circuit.

FIG. 2 is a block diagram of a clock repeater chip 20 including a delay regulator circuit. The system clock signal, PHO on line 25, and the second clock signal, PH90 on line 35, are received at an input "buffer" stage 40, where they are processed, i.e., shaped and amplified. The processed clock signals may then be driven directly, i.e., "simple mode path" via line 26, to an output buffer stage 45 where they are regenerated into multiple copies for distribution to circuitry 24 on the module. As an alternative, the processed clock signals may be driven through a clock delay path 60 (FIG. 2) via a "process, voltage, temperature and loading (PVTL) mode path" 28 that is used to delay the signals prior to delivery to the output buffer stage 45.

Figure 3:
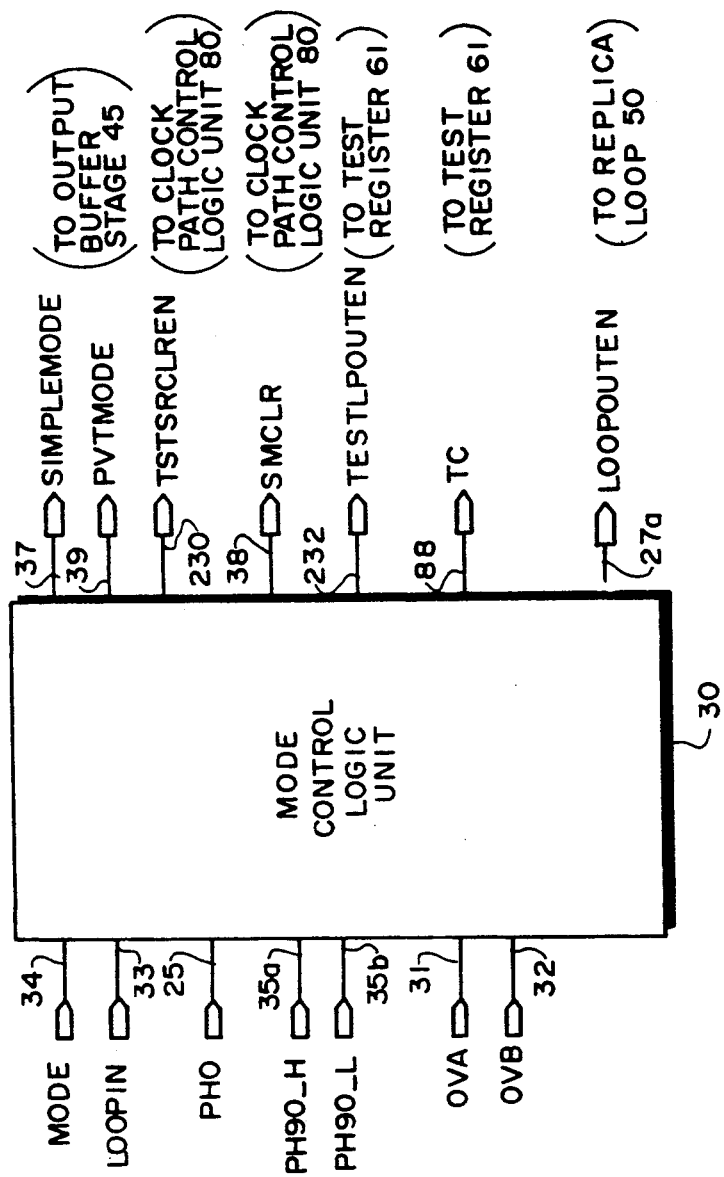
FIG. 3 is a block diagram of a mode control logic circuit of the repeater chip including a truth table depicting the relationship between input and output signals of the mode control unit.

Selection of simple or PVTL mode is determined by a mode control logic unit 30. A truth table of FIG. 3 depicts the relationship between input and output signals of the unit 30. It will be understood to those skilled in the art that the table can be used to implement logic circuitry for the mode control unit 30. Simple mode allows the clock repeater chip 20 to operate at relatively low frequencies; this is advantageous when low speed, computer testing is performed. A LOOPIN signal on line 33 and a MODE signal on line 34 are used to select the simple mode path of the output buffer stage 45 via a SIMPLEMODE signal on line 37; PVTL mode is selected via the PVTMODE signal on line 39. Furthermore, the LOOPIN pin 33, which is shared between the mode control unit 30 and an input to the clock delay path 60, is used to enable a "test" of operation. When in test mode, the PH90 clock signal channel 35 is not used; therefore its differential input pins, i.e., PH90_H on line 35a and PH90 L on line 35b, are used to select four sub-testing modes of operation. The PHO system clock signal on line 25 is used to activate the logic circuitry used for each sub-mode. A more detailed description of the testing operation and the signals generated by the mode control unit is provided below in connection with FIG. 7.

Overflow input signals, OVA on line 31 and OVB on line 32, are used in connection with an auto-ranging feature of the invention; this feature extends the frequency range of the clock repeater chip. A state machine clear signal SMCLR on line 38 is used to clear sequential logic circuit of a clock path control unit 80 (FIG. 5), while a signal LOOPOUTEN on line 27a enables certain logic circuitry of a replica loop circuit 50.

Figure 4:
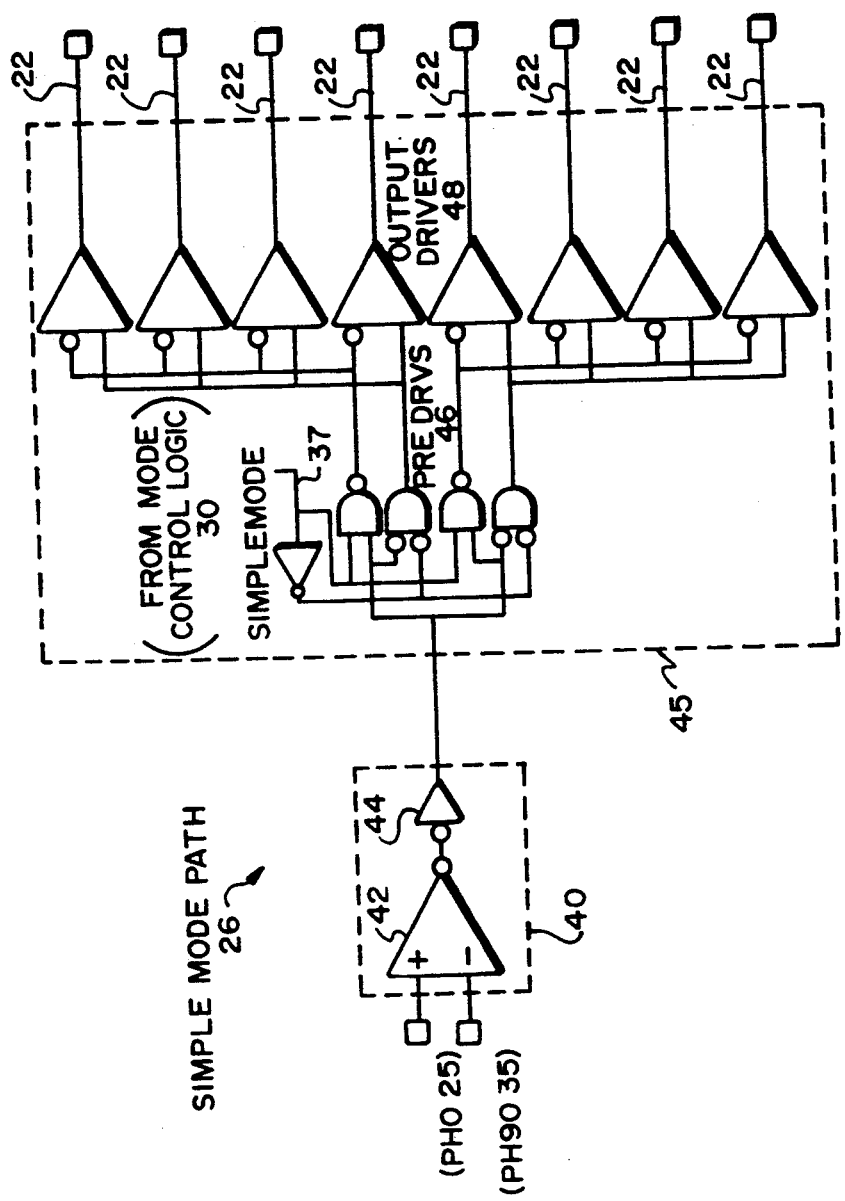
FIG. 4 is a diagram of a simple mode clock path of the repeater chip of FIG. 2.

FIG. 4 is a diagram of the simple mode path 26. The input buffer stage 40 comprises differential and post-amplifier circuitry. Specifically, a differential amplifier 42 receives a low-level input signal, i.e., either square or limited-edge rate wave, and produces a "shaped", amplified square wave pulse having approximately the desired amplitude. The post-amplifier 44 "cleans-up" the differential amplifier output signal; that is, it functions as a level-shifter to deliver a full amplitude signal to the output buffer stage 45. The post-amplifier 44 also ensures the duty cycle of the signal is correct and in phase with the input signal PHO on line 25 (or PH90 on line 35).

The output buffer stage 45 comprises a predriver section 46 including AND and NAND gate circuitry, and an output driver section 48 including a plurality of tri-state drivers. The output buffer section 45 is divided into two segments to accomodate the simple mode 26 and the PVTL mode 28 paths. For purposes of clarity, only the simple mode segment is shown. Functionally, the predrivers 46 are enabled by the SIMPLEMODE signal on line 37 generated by the mode control logic unit 30. The predrivers 37, in turn, generate multiple copies of the processed input signal, while the output drivers 48 distribute these signals to circuitry on the module.

Referring again to FIG. 2, the PVTL mode path 28 enables measurement and delay compensation for the processed input signal. An absolute delay regulator circuit operates in a cyclical fashion by periodically measuring the intrinsic delay of a clock path, including the PVTL clock delay path 60, on the chip 20. After a measurement, one of two delay adjusting units within the clock delay path 60 is updated, while the other delay unit determines the actual delay of the chip 20 from a previous measurement cycle. Specifically, the regulator updates a delay unit by adding a controlled amount of delay to the processed clock signal propagating through a delay line so that the output clock signal maintains a fixed-phase relationship with the input signal.

The PVTL clock delay path 60 on the repeater chip 20 includes the logic circuitry required to measure and compensate for the intrinic delay of the chip. A "replica loop" circuit 50 simulates the logic and associated propagation delay of the clock path, as described further herein. An external loading network 55, coupled between LOOPIN on line 33 and LOOPOUT on line 27, simulates the loading of printed circuit board etch traces connected to the outputs of chip 20, leading to external loads. A pulse generator 90 supplies a precise measurement pulse needed to operate the clock delay path 60 and replica loop 50, while a clock path control logic unit 80 provides the necessary timing signals to perform delay regulation on the chip 20.

Figure 5:
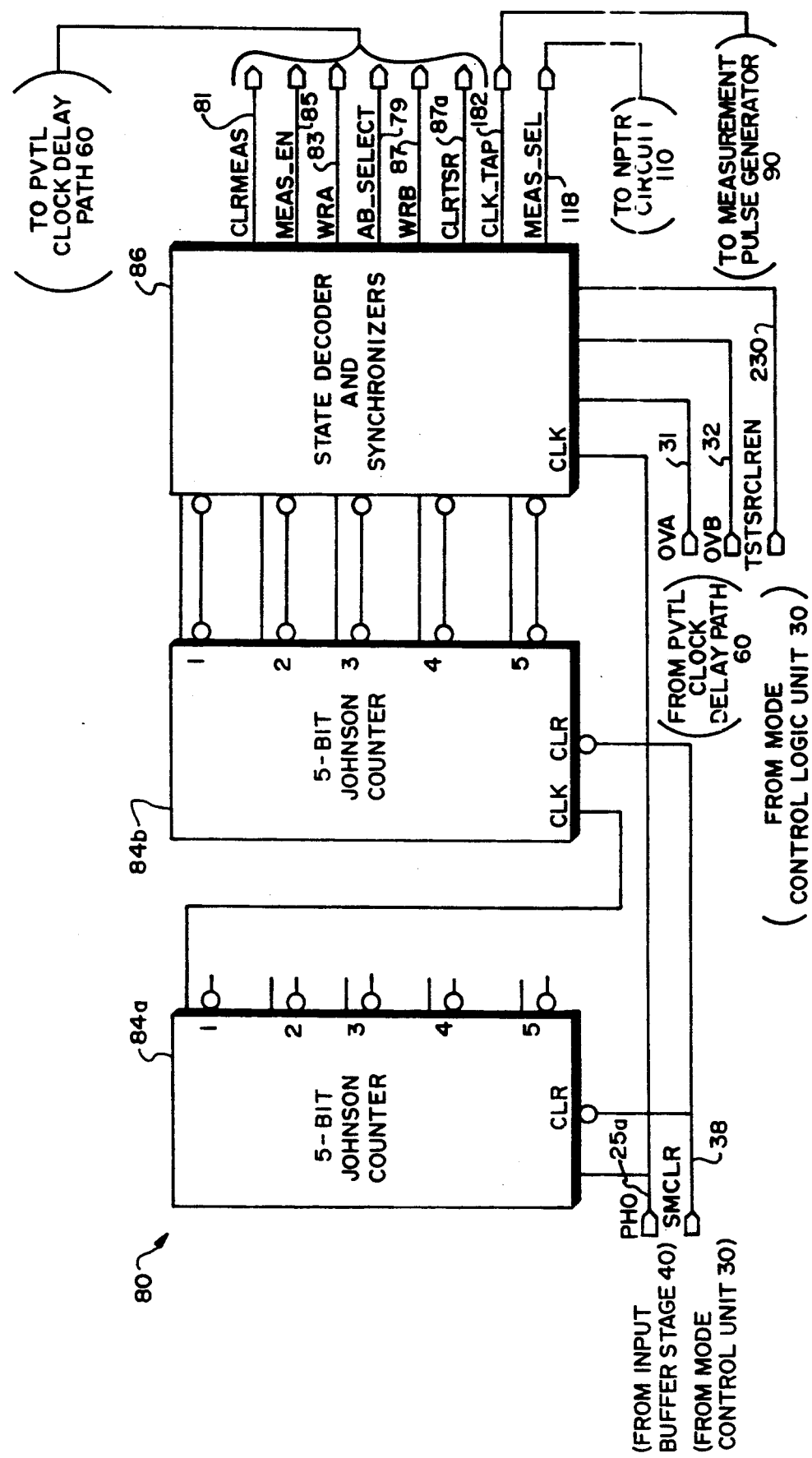
FIG. 5 is a block diagram of a clock path control logic unit of the delay regulator.

FIG. 5 is a block diagram of the clock path control logic unit 80, which preferably comprises registers and combinational logic configured to produce a sequential logic circuit, e.g., a "state machine". In an embodiment of the clock path control logic 80, the state machine comprises two cascaded, 5-bit Johnson counters 84a, 84b coupled to a decoder and synchronizer unit 86. The state machine, herein also referred to at 80, controls the sequencing of operations during a PVTL delay regulation cycle by generating timing signals used in the operation of the PVTL clock delay path 60. Specifically, a cycle of operation is as follows:

1. State 0: Clear measurement latch;
2. State 1: Generate measurement pulse, freeze measurement result in measurement latch and toggle clock delay control register selection via AB_SELECT to select B delay control register (and clock B delay line) for delaying clock signal;
3. State 2: Write measurement word (stored in measurement latch) after decoding into A delay control register. The tap on clock A delay line is set to reflect the recent measurement. Clock B delay line (one for each clock phase) still controls clock delay;
4. State 3: Clear measurement latch;
5. State 4: Generate measurement pulse, freeze result in measurement latch and toggle clock delay control register selection via AB SELECT to select A delay control register (and clock A delay line) for delaying clock;
6. State 5: Write measurement word (stored in measurement latch) after decoding into B delay control register. The tap on clock B delay line is set to reflect the recent measurement. Clock A delay line (one for each clock phase) still controls clock delay;
7. State 6: Spare—not used;
8. State 7: Spare—not used;
9. State 8 Clear test register and "self-clean" the control logic state machine;
10. State 9 Spare—not used;
11. Return to State 0.

Figure 6:
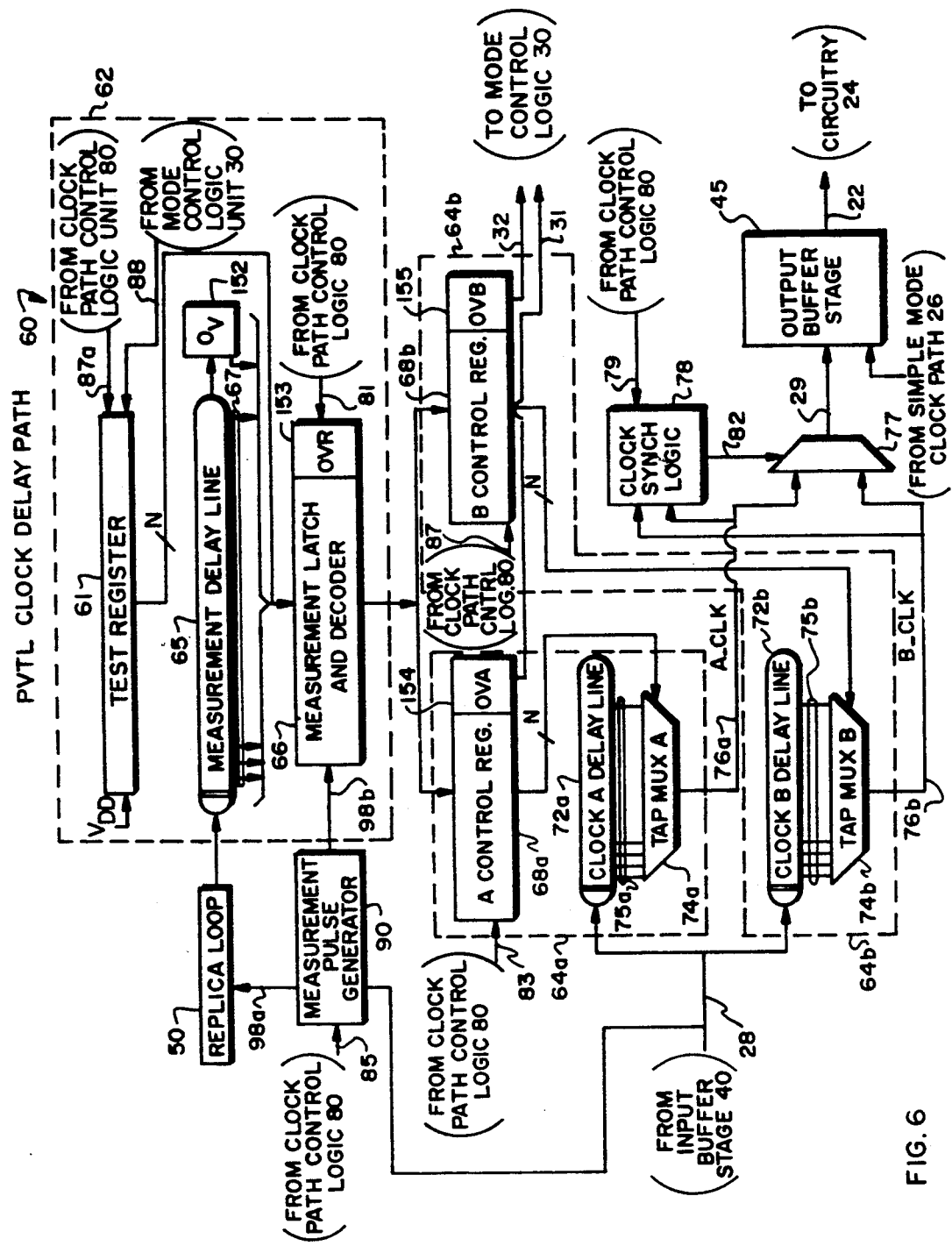
FIG. 6 is a block diagram of a clock delay path of the delay regulator.

A block diagram of the PVTL clock delay path 60 of the delay regulator is depicted in FIG. 6. The clock delay path 60 is preferably one hundred and forty-four bits wide and generally includes a measurement circuit 62 and a pair, i.e., A and B, of delay adjusting units 64a, 64b, generally designated 64. A measurement signal propagates through the replica loop 50 and into a tapped measurement delay line 65 where an "absolute" measurement of the chip intrinsic propagation delay is performed. The tapped delay line 65 preferably comprises a string of inverters. To maintain correct polarity from the delay line, the taps are placed at the outputs of inverter-pairs. The delay resolution of the system is thus an inverter pair, which is a unit of measurement granularity.

The results of the measurement are then loaded into a measurement latch 66 where they are decoded by an internal decoder circuit. In a preferred embodiment of the invention, the decoder circuit (not shown) employs a conventional Johnson counter-style decoder configuration. The decoded signals may thereafter be loaded into control registers 68a, 68b, generally designated 68, of the A and B delay adjusting units 64. In addition to the control registers, each delay unit 64 includes a clock delay line and a tap select multiplexer. The clock delay lines 72a, 72b, generally designated 72, receive a processed clock signal on line 28 from the input buffer stage 40. The use of two delay adjusting units 64, i.e., "double-buffering", allows the regulator to adjust the clock signal in one of the units by adding the desired delay, while the other unit still compensates for the previously-measured intrinic delay of chip. This technique contributes, in part, to a noninterrupted output clock signal.

The output of each delay control register 68 enables respective A and B tap select multiplexers 74a, 74b, generally designated 74, to select an appropriate tap from its associated clock delay line 72. As with the measurement delay line 65 described previously, the A and B delay lines 72 preferably comprise a string of inverters having taps at inverter-pair outputs. In a preferred embodiment of the invention, the delay lines 65 and 72 employ two hundred and eighty-eight inverters or one hundred and forty-four inverter-pairs 70 with one hundred and forty-four taps 67 and 75a, 75b, respectively. A selected tap inserts a desired amount of delay to the processed input clock signal.

Each tap multiplexer 74 has an input for every tap in the delay line 72 and one output. The multiplexer 74 is preferably implemented as an array of gates in a generally conventional "OR tree" configuration. The multiplexer 74 selects one of the one hundred and forty-four taps 75 from the clock delay line 72, which, in turn, inserts the proper amount of delay to the processed clock signal on line 28 driven into the clock delay lines. The resulting A and B clock signals, A_CLK on line 76a and B_CLK on line 76b, from the multiplexers 74 are thereafter coupled to a two-to-one clock delay multiplexer 77 that is enabled by clock synchronization logic 78. Here, one of the clock signals is selected and forwarded via a delay-regulated clock path 29 to the output buffer stage 45 for distribution to circuitry 24 on the module. Thereafter, the roles of the A and B delay adjusting units are switched.

It is thus clear that a complex signal path is required to perform measurement and delay-regulation for a clock signal distributed throughout the computer system. Certain portions of the clock delay path may be utilized only under extreme PVTL conditions. Therefore, the entire clock path circuitry should be functionally exercised to ensure proper operation of the delay regulator.

Figure 7:
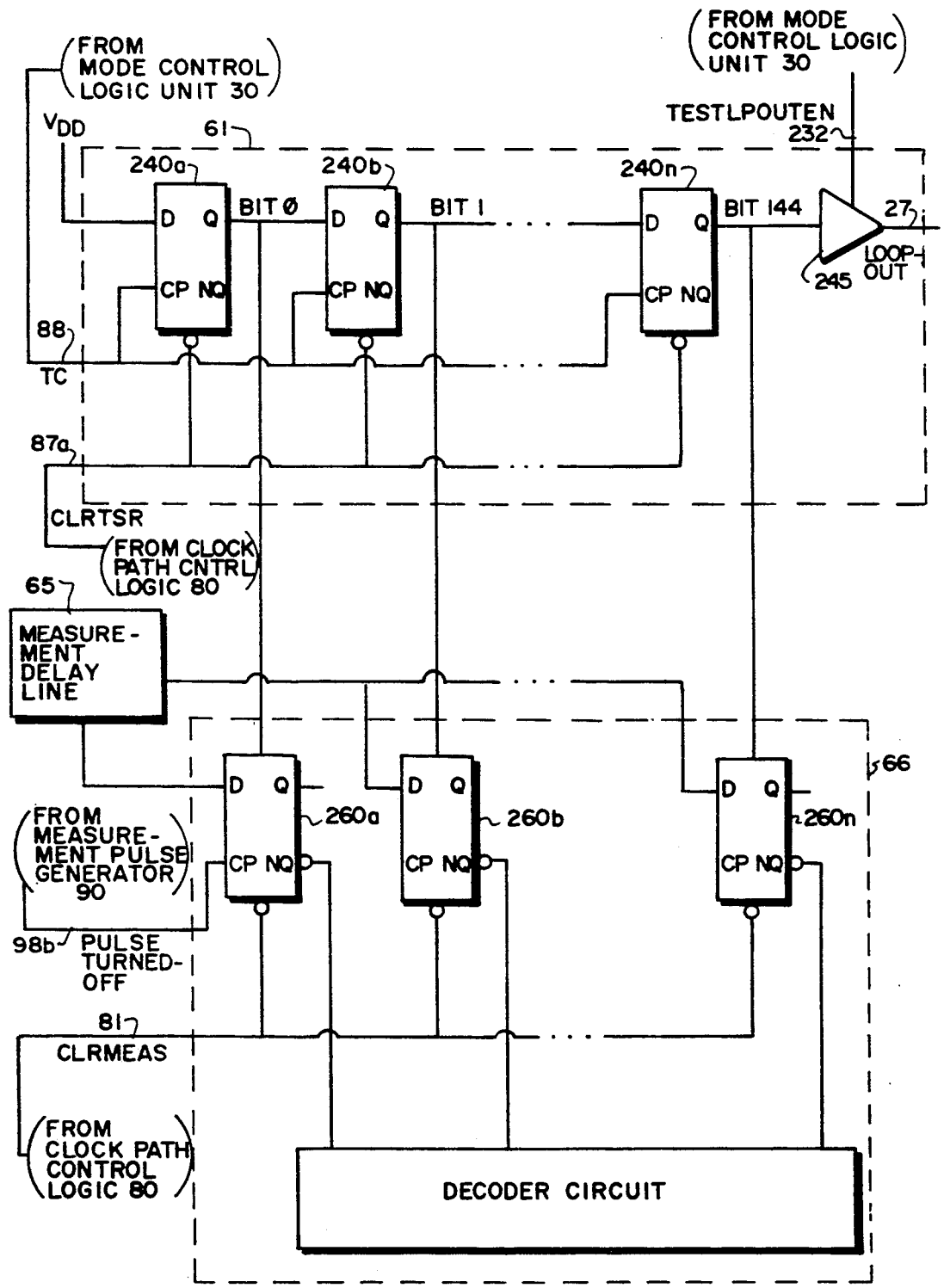
FIG. 7 is a block diagram of a test register and a measurement latch of the clock delay path of the delay regulator in accordance with the invention.

In accordance with the invention, a test register 61 allows for complete functional testing of the PVTL clock delay path 60 of the delay regulator. The test register 61, which is coupled to the measurement and decode latch 66 in a "logical OR" configuration with respect to the measurement delay line 65, provides a means by which test patterns may be inserted into the repeater chip 20 during a test mode to fully exercise the entire clock delay path of the delay regulator. FIG. 7 is a block diagram of the test register 61 and measurement latch 66.

The test register 61 is a 145-bit register comprising a series of D-type flip-flop devices 240a-n (where n=144) configured as a shift register. Specifically, the D-input of the first device 240a is tied to a hardwired logical "1", e.g., $V_{DD}$; thereafter, the Q-outputs of the devices, generally designated 240, are tied to the D-inputs of adjacent devices 240 in a cascaded manner. The Q-output of the last device 240n is coupled to the input of a tri-state driver 245 that is enabled by a signal TESTLPOUTEN on line 232 from the mode control logic unit 30 (FIG. 3). The D-type devices 240 are clocked by a TC signal on line 88 from the mode control logic unit 30, while a CLRTSR signal on line 87a from the clock path control logic 80 is tied to the clear input of each device.

The Q-output of each device 240 of the test register 61 is also coupled to a set input of a corresponding bit of the measurement latch 66. Here, the D-input of each bit location, generally designated 260, of the latch 66 is connected to a corresponding tap of the measurement delay line 65, while each NQ-output is coupled to the internal decoder circuit of the measurement latch 66. Each bit location 260 is clocked by the measurement pulse emanating from the measurement pulse generator 90. The clear input of each location 260 is coupled to a CLRMEAS signal on line 81 from the clock path control logic 80.

The timing signals used to activate the clock delay path logic are based on the non-delayed system input clock signal PH 0. FIGS. 3 and 5 depict the input signals and control logic used to generate the timing signals. As noted, the MODE and LOOPIN signals on lines 34 and 33 are used to place the repeater chip 20 in a test mode. Specifically, test mode is entered by placing non-asserted signals on both the MODE line 34 and LOOPIN line 33 of the chip. This deactivates the measurement delay line 65 by decoupling the replica loop 50 from the clock path, thus forcing a sequence of logic "0" bits into the delay line 65.

Again as noted, the second phase clock signal PH 90 channel is not used during testing; therefore, its differential input pins, 90_H and 90_L, are used to select four sub-testing modes. The various combinations of differential input pins used to enter the four modes are as shown below, with a "0" indicating a non-asserted signal and a "1" indicating an asserted signal:

TABLE 1

| TEST TRUTH TABLE | | |
|---|---|---|
| MODE | 90_H | 90_L |
| Tri-state | 0 | 0 |
| Reset State Machine | 1 | 0 |
| Measurement Test | 0 | 1 |
| Test Register Shift | 1 | 1 |

The tri-state mode effectively disables the output lines of the repeater chip 20 by placing its output drivers 48 of the output buffer stage 45 (FIG. 4) in high-impedance state; this is accomplished by deasserting SIMPLEMODE on line 37 and PVTMODE on line 39 (FIG. 3). Tri-state mode is used during manufacture testing of circuitry other than the repeater chip 20 on the module. The reset state machine mode is used to place the clock path logic state machine 80 in a known state, i.e., state 0 of the delay regulation cycle.

Referring also to FIGS. 6 and 7, the test register shift mode loads a selected pattern of logic "1" bits into the test register using the TC signal on line 88 to clock the test register flip-flop devices 240 and advance the loaded bits throughout the register 61. The measurement test mode then initiates a "test" measurement cycle by loading the selected test pattern from the test register 61 into the measurement latch 66.

Operationally, the control logic state machine 80 is inhibited from clearing the test register 61 with the CLRTSR signal on line 87a in test mode; it then clears the measurement latch 66 using the CLRMEAS signal on line 81 (see states 8 and 0 of delay regulation cycle). The "1's-only" bit test pattern is then shifted into the test register 61 using the TC signal on line 88. As each bit of the register 61 is set, a corresponding bit in the measurement latch 66 is also set. This simulates the results of a measurement cycle with the test register contents stored in the measurement latch 66.

Once the test pattern is loaded, the repeater chip 20 is placed into a measurement test mode. Since the measurement line 65 is fully loaded with logic "0" bits, the contents of the test register 61 override the output of the measurement delay line 65. In a preferred embodiment of the invention, a minimum of one hundred PH 0 clock cycles are needed to ensure that a measurement test cycle operation has selected the clock delay paths of the A and B delay adjusting units 64a and 64b at least once. A clock output on line 22 of the chip 20 is then sampled; if a clock signal is present, then that column in the clock delay path is considered to be functional.

Another test pattern corresponding to an incremental amount of delay is loaded into the test register 61 and the measurement test cycle is executed. This procedure is repeated until a test pattern corresponding to the maximum delay provided by the delay line 65 is loaded, the measurement test cycle executed and the output signal on line 22 sampled to indicate a fully functional chip. At this point, all columns, i.e., bit-slices, of the clock delay path have been individually exercised.

It is apparent that each possible combination of the 144-bit register can be selected as a test pattern to fully exercise each column, i.e., bit-slice, of the PVTL data path, including all clock delay taps of the delay lines. Moreover, the logic of each bit-slice of the data path must be functional in order to produce a signal at the chip output pins. Therefore, a fault in the data path logic is manifested by the lack of an output signal for a particular test pattern. Once completed, test mode is exited by asserting the LOOPIN signal.

The foregoing description has been directed to a specific embodiment of this invention. It will be apparent, however, that variations and modifications may be made to the described embodiment, with the attainment of some or all of its advantages. Therefore, it is the object of the appended claims to cover all such variations and modifications as come within the true spirit and scope of the invention.

What is claimed is:

1. Method for testing logic devices of a complex signal path of a semiconductor chip, said logic devices including at least a measurement latch circuit, said method comprising the steps of:

placing said chip in a test mode in response to first control signals and forcing a sequence of unasserted bits into a measurement delay line circuit having signal outputs connected to said measurement latch circuit, and further placing said chip in a plurality of sub-test modes in response to second control signals to enable complete functional testing of said logic devices of said complex signal path;

shifting a selected pattern of asserted bits into a test register, located on said chip, in response to a clocking signal, said test register being connected to said measurement latch circuit, said selected pattern of asserted bits comprising a test pattern;

loading said test pattern from said test register into said measurement latch circuit and thereafter into said logic devices of said complex signal path when said chip is placed in a measurement test sub-mode of said test mode, said test pattern overriding the signal outputs of said measurement delay line;

generating timing signals with a control logic unit to activate said logic devices of said signal path during said measurement sub-mode; and sampling an output clock signal of said chip to determine whether said clock signal is present at the output line of said chip, whereby the presence of said output clock signal indicates that said logic devices of said complex signal path exercised by said test pattern are functional.

2. Apparatus for testing logic circuits in a complex signal path in a semiconductor chip, said logic circuits including a measurement latch and decoder circuit connected to a plurality of delay adjusting units configured to produce a delay-regulated clock signal at the output of said chip, the sequencing of operations of said logic circuits being initiated by a signal path control logic unit in accordance with a measurement regulation cycle, said apparatus comprising:

a test register located on said chip, said test register having a serial input connected to a source of a signal in a predetermined logical state and having a plurality of outputs connected to corresponding ones of a plurality of inputs of latch devices of said measurement latch and decoder circuit, said latch devices further having a plurality of outputs connected to corresponding inputs of a decoder circuit of said measurement latch and decoder circuit; and a mode control logic unit for placing said semiconductor chip in a test mode of operation in response to first control signals, said mode control logic unit further generating first and second timing signals in response to a plurality of second control signals that place said semiconductor chip in a plurality of sub-test modes of operation, said sub-test modes of operation including:

a reset mode for placing said signal path control logic unit in a known state of said measurement regulation cycle in response to said first timing signal;

a shift mode for loading a pattern of said predetermined logical signal states into said test register in response to said second timing signal; and a measurement test mode for loading said pattern of predetermined logical signal states from said test register into said logic circuits of said signal path in accordance with said measurement regulation cycle, wherein said pattern of predetermined logical signal states propagates through said logic circuits and said delay-regulated clock signal at the output of said chip is sampled to determine successful testing of said logic circuits.

3. The apparatus of claim 2 wherein said test register comprises a plurality of cascaded flip-flop devices configured as a shift register.

4. The apparatus of claim 3 wherein said plurality of cascaded flip-flop devices are arranged such that the D-input of a first of said cascaded devices is connected to said source and the Q-outputs of each of said cascaded devices are connected to the D-inputs of each adjacent of said cascaded devices.

5. The apparatus of claim 4 wherein each of said Q-outputs of said cascaded flip-flop devices is connected to a set input of a corresponding one of said latch devices.

6. The apparatus of claim 5 wherein said first control signals include a MODE signal and a LOOPIN signal.

7. The apparatus of claim 6 wherein said second control signals include a PH90_H signal and a PH90_L signal.

8. The apparatus of claim 7 wherein said first timing signal generated by said mode control logic unit is a SMCLR signal used to clear a sequential logic circuit of said signal path control logic unit.

9. The apparatus of claim 8 wherein said second timing signal generated by said mode control logic unit is a TC signal used to clock said plurality of cascaded flip-flop devices of said test register.

10. The apparatus of claim 2 wherein said signal path control logic unit comprises two cascaded Johnson counters coupled to a decoder and synchronizer unit.

11. The apparats of claim 10 wherein said predetermined logical signal sate is a hardwired logical "1" signal.

* * * * *